LOW FREQUENCY AMPLIFIER EMPLOYING FIELD EFFECT DEVICE

Filed May 2, 1960

INVENTOR
Arthur D. Evans
& Jack S. Kilby
BY Stevens, Davis, Miller & Mosher
ATTORNEYS INVENTOR
Arthur D. Evans
& Jack S. Kilby
BY Stevens, Davis, Miller & Mosher
ATTORNEYS INVENTOR
Arthur D. Evans
& Jack S. Kilby
BY Stevens, Davis, Miller & Mosher
ATTORNEYS

LOW FREQUENCY AMPLIFIER EMPLOYING FIELD EFFECT DEVICE

Filed May 2, 1960 4 Sheets-Sheet 4

INVENTOR
Arthur D. Evans
& Jack S. Kilby
BY Stevens, Davis, Miller & Mosher
ATTORNEYS

3,222,610
LOW FREQUENCY AMPLIFIER EMPLOYING FIELD EFFECT DEVICE

Arthur D. Evans, Farmers Branch, and Jack S. Kilby, Dallas, Tex., assignors to Texas Instruments Incorporated, Dallas, Tex., a corporation of Delaware Filed May 2, 1960, Ser. No. 26,136
3 Claims. (Cl. 330—38)

This invention relates to solid semiconductor networks and more particularly to such networks which feature active elements with high effective input impedances.

Semiconductor networks have heretofore been proposed, illustrative of which are those disclosed in an application by Jack S. Kilby, S.N. 791,602, filed February 6, 1959, now Patent No. 3,138,743, and entitled, "Miniaturized Electronic Circuits." According to that patent, entire electronic networks are fabricated entirely within tiny wafers of semiconductor material, for various portions of the material act as discrete circuit elements, and other portions of the material act to connect internally certain of the circuit elements as required.

Although the subject matter of the Kilby patent constitutes a major breakthrough in the art of circuit miniaturization, and although through its practice any of a wide variety of electronic networks can be formed within a single tiny wafer of semiconductor material, problems have arisen when the frequency characteristics of some of the networks have been lowered to include the audio range. Thus, for example, when it has been desired to form a complete low frequency amplifer within a tiny wafer of semiconductor material, the input impedance level of the amplifier has been sufficiently low so as to require the inclusion of relatively high-valued capacitors.

The problem that low input impedance presents in terms of a requirement for high values of capacitance will be appreciated when it is recognized that frequency response characteristics of an amplifier are in large measure determined by the ratio of coupling and bypass capacitor reactances to the impedances presented at the electrodes of the amplifier active elements (e.g., transistors). Thus, since the input impedances of bipolar transistors are relatively low, the capacitive reactances required for the associated capacitors must be correspondingly low at the frequencies involved, and this in turn required that in low frequency embodiments the values of the capacitors be relatively high.

It is generally recognized that one of the major factors influencing the capacitance presented by a capacitor relates to the effective areas of the capacitor electrodes. Thus, the value of capacitance available in a given design will vary directly as a function of the area thereof; and, although relatively large values of capacitance can be obtained by increasing the size of the semiconductor wafers proposed in the foregoing patent, an inordinate increase in such size would tend to offset one of the major advantages thereof, namely, the extremely small size of the integrated network. Consequently, it has not been found practicable to exceed certain values of capacitance if the full advantage of small size is to be obtained.

The present invention advantageously overcomes the problem of obtaining large capacitance values in tiny integrated electronic circuits by advantageously increasing the input impedance of the active elements by several orders of magnitude. Consequently, since the frequency response is largely dependent upon the *ratio* of input impedance to capacitance (i.e., coupling capacitance, bypass capacitance, etc.), frequency response can be extended many octaves without changing capacitance values. Thus, full advantage may be taken of the remarkable characteristics of the prior art proposals in low frequency embodiments without sacrifice to extreme reduction in size. According to the present invention, the above is accomplished by a cooperative arrangement of a field-effect device and related circuit elements.

Field-effect devices themselves are old in the art, and reference is made to Patent 2,744,970 granted to W. Shockley for an understanding thereof. As will be apparent from a reference to that patent, field-effect devices exhibit the characteristic of high input impedance. However, although the proposals for field-effect devices have held great promise, many problems have been encountered in production, and consequently they have never found significant commercial success.

Recent improvements have overcome many difficulties previously encountered. Thus, structures have been disclosed which offer significant advantages that greatly lessen manufacturing problems. However, there has been no proposal for the integration of a field effect device into a semiconductor electronic network.

It is one general object of this invention to impart greater versatility to semiconductor networks.

It is still another object of this invention to extend the frequency range over which networks of minimum size can be effectively operated.

It is still another object of this invention to raise greatly the effective input impedance of active elements within integrated electronic networks.

It is still a further object of this invention to optimize the ratios between impedances present at active element electrodes and the reactances presented by associated capacitors.

Consequently, and in accordance with one feature of the invention, a field-effect transistor is advantageously integrated into a semiconductor network and is arranged as an input element whereby an extremely high input impedance is effectively obtained.

In accordance with another feature of the invention, integration of the field effect device is accomplished in such manner that interconnection of the field-effect device with related passive elements is accomplished entirely within a single semiconductor wafer.

In accordance with still a further feature of the invention, in one particular embodiment, a field-effect device and a bipolar transistor device are both cooperatively integrated within a single semiconductor wafer in such manner that interconnections therebetween are advantageously made within the wafer and with optimum impedance relationships. Thus, not only are both elements entirely formed within a semiconductor wafer, but their formation is so coordinated as to optimize their operative interrelationships.

In accordance with yet another feature of the invention, parts of several elements, including the field-effect device, are formed simultaneously by the advantageous multiple effect of selected steps.

In accordance with yet a further feature of the invention parts of several elements, including the field-effect device, are formed simultaneously by the advantageous multiple effect of selected steps.

In accordance with yet a further feature of the invention, in one embodiment an entire two-stage amplifier is integrated into a wafer of material, and a field-effect structure is arranged in cooperative relationship with an associated capacitor. Thus, a virtual low pass filter is formed and is connected to provide a D.-C. feedback path to stabilize amplifier bias.

These and other objects and features of the invention will be apparent from the following detailed description, by way of example, with reference to the drawing in which.

Figure 4A:
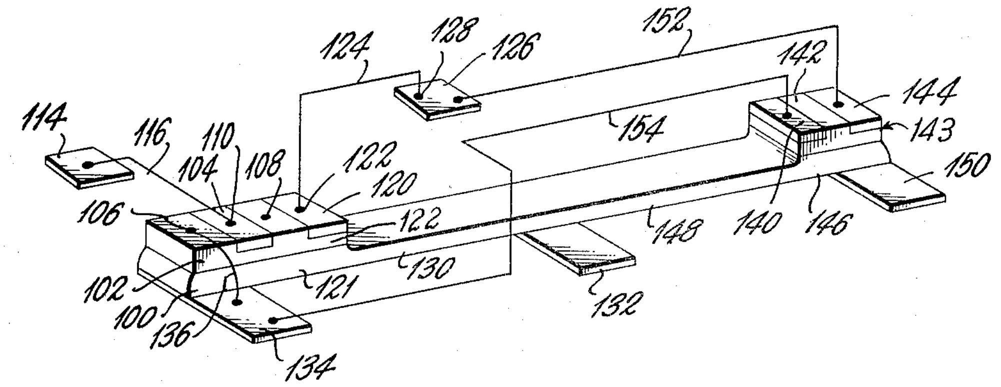
Figure 4B:
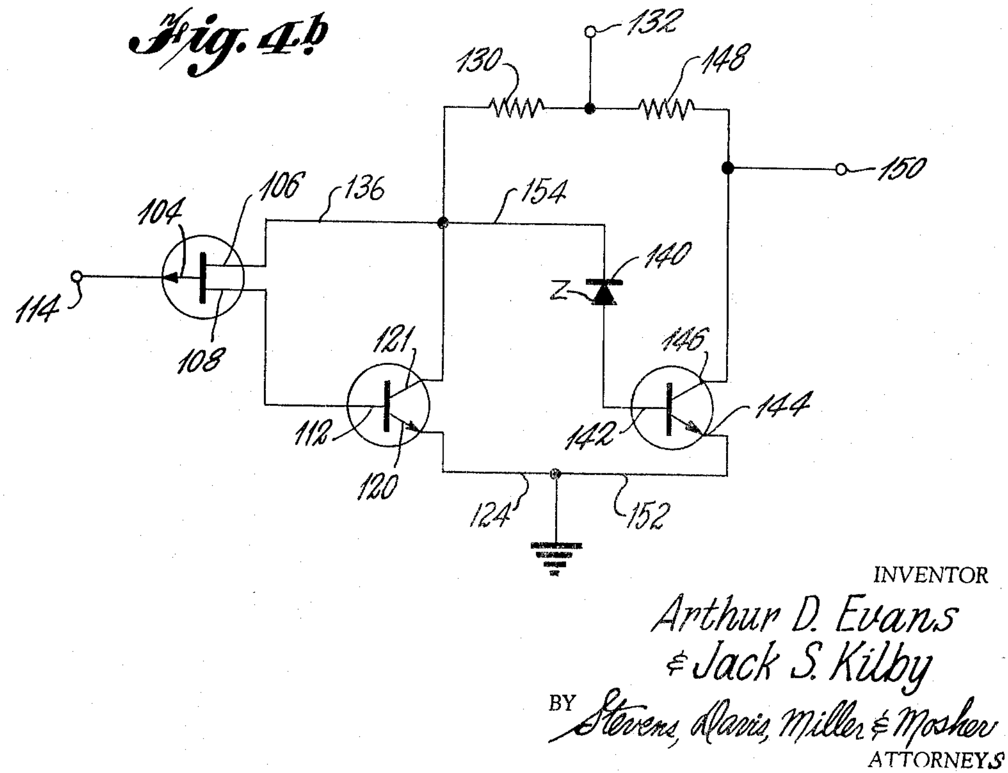
Figure 4C:
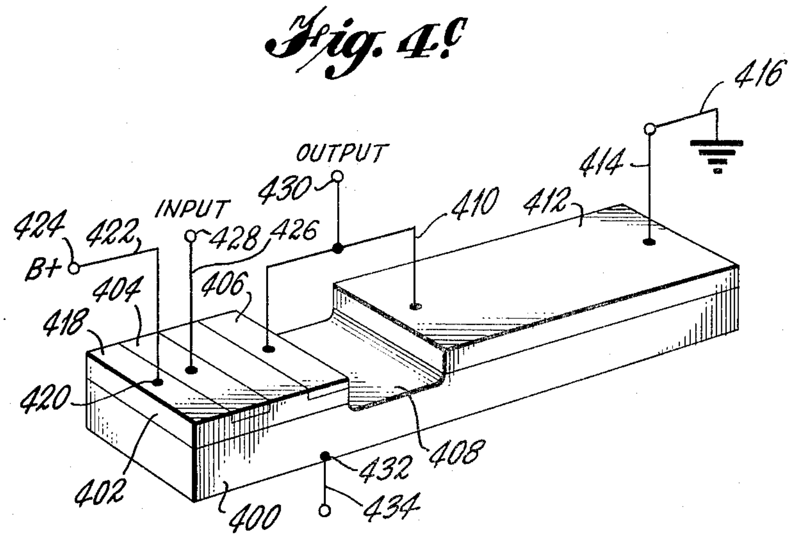
Figure 4D:
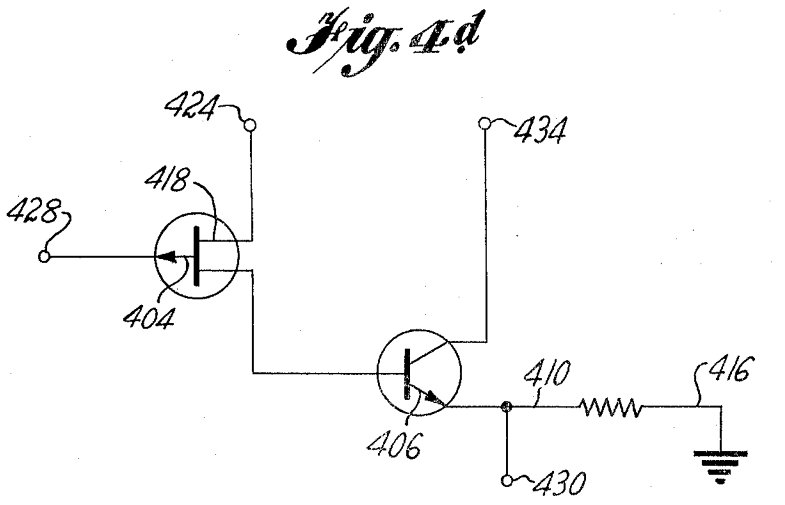
Figure 5A:
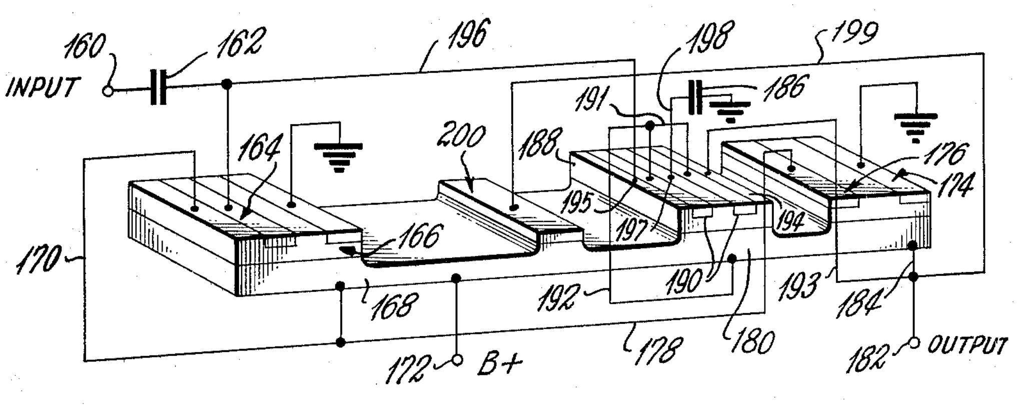
Figure 5A:
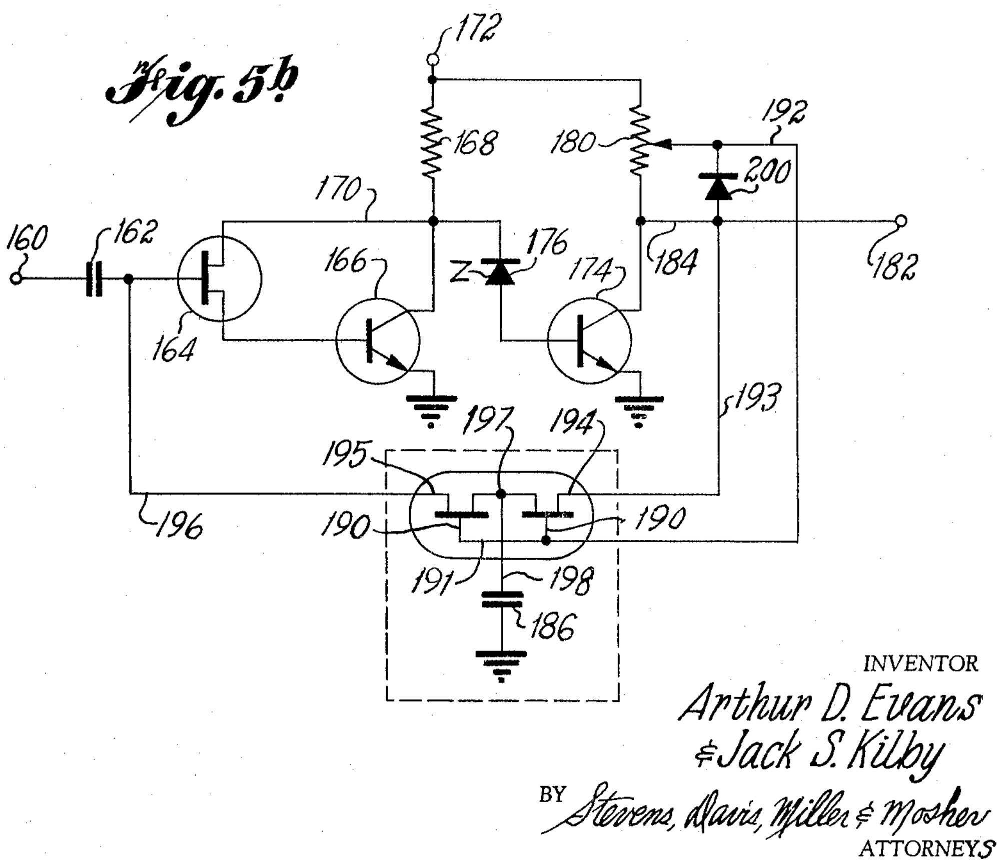

FIGURE 4*a* is a perspective view of a novel semiconductor network embodying the principles of the invention;

FIGURE 4*b* is an equivalent circuit diagram of the network shown in FIGURE 4*a*;

FIGURE 4*c* is a perspective view of another novel semiconductor network;

FIGURE 4*d* is an equivalent circuit diagram of the network shown in FIGURE 4*c*;

FIGURE 5*a* is a perspective view of a still yet another novel semiconductor network embodying the principles of the present invention; and FIGURE 5*b* is an equivalent circuit diagram for the network of FIGURE 5*a*.

As noted, the principle object of this invention is to provide audio amplifier designs compatable with semiconductor network technology as taught in the aforementioned Kilby patent. Two main problems are encountered in designing audio circuits to be incorporated in a single piece of semiconductor material. The input to a transistor amplifier stage inherently has a low impedance; therefore, a large coupling capacitor, one to ten microfarads, is required to match impedance. It is hard to design a solid-state circuit that has such a large capacitance because of the large area that would be required. More reasonable capacitor values would be 0.001 to 0.010 microfarad. 0.001 microfarad is a convenient size capacitor to build into a solid-state circuit. Another problem encountered is the temperature dependence of the semiconductor material parameters, and their effect upon device and circuit performance. This problem manifests itself by instability of the D.C. bias voltages of the amplifier.

Figure 1:
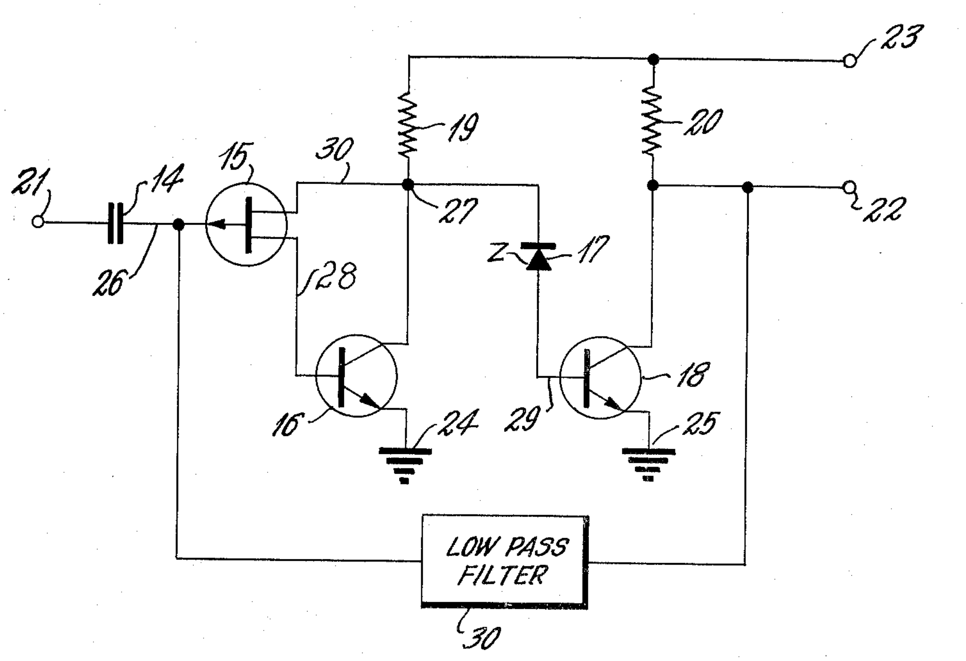
FIGURE 1 is a schematic diagram of the novel audio amplifier of the present invention.

The problems dealt with in the preceding paragraph are overcome in the circuit shown in FIGURE 1. An input 21 is connected directly to coupling capacitor 14 which connects into the gate 26 of field effect transistor 15. This gate circuit is inherently a high-impedance circuit, and therefore, a small coupling capacitor can be used. The channel of the field effect transistor is defined between the source 30 and the drain 28 of the transistor. The drain 28 is connected to the base of an NPN transistor 16. The emitter of transistor 16 is connected to ground. The channel circuit of the field effect transistor is inherently a low-impedance circuit, and therefore matches to the low-input impedance of the base of the transistor 16. Load reistor 19 is connected to the collector of transistor 16 and to a supply voltage terminal 23. The source 30 of the field effect transistor 15 is connected to terminal 27 between the load resistance 19 and the collector of the transistor 16. The field effect transistor 15, transistor 16 and resistor 19 form a first amplification stage which is similar in operation to a "cathode follower" network in that it has an amplification factor of less than unity, high input impedance and low output impedance. The second stage of amplification is also an NPN transistor 18 with its collector connected into a load resistance 20, which is connected to voltage supply terminal 23. The emitter of transistor 18 is grounded. Under normal operating conditions the point 27 will be at a potential of approximately one half that at terminal 23. It is desirable to drive the base of the second amplification stage at approximately six-tenths of a volt. Therefore, some means is required to drop the voltage from point 27 of the first stage to approximately 0.6 volt at the input of the second stage. A device that would regulate the voltage on the input of the second stage at this value and also be satisfactory from an impedance standpoint is a Zener diode. Thus, Zener diode 17 is used to couple point 27 of the first stage to the base of transistor 18, thereby maintaining the input voltage of the second stage at approximately 0.6 volt.

To overcome temperature instability of the D.C. bias conditions it is necessary to incorporate some means to stabilize the voltage on the gate of the field-effect transistor 15. This is accomplished by using negative feedback from the output 22 of the second stage to the gate 26 via a low-pass filter 30.

Figure 2:
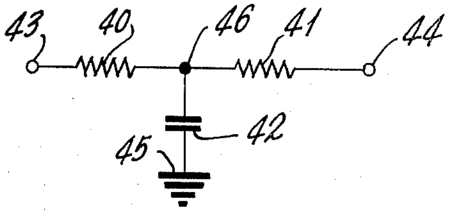
FIGURE 2 is a schematic diagram of a low-pass filter circuit.

An example of a typical low-pass filter is given in FIGURE 2. It consists of two resistors 40 and 41 in series, with a capacitor 42 connected to a junction 46 between the two resistors and to ground 45. Terminal 43 is connected to the gate of the field-effect transistor 26 and terminal 44 is connected to the output 22 of the second stage. Because of the high-input impedance to the gate of the field-effect transistor 15, reasonably large resistors are necessary in the low-pass filter. These resistors should be in the order of $10^7$ ohms. Another reason for using high values of resistance for resistor 40 and resistor 41 is to allow capacitor 42 to be of relatively low capacitance but still achieve good attenuation of the A.-C. signal in the feedback loop. This low-pass filter then allows the A.C. to be filtered out to ground 45, blocks the D.C. from passing to ground 45, and allows a negative feedback D.C. voltage to be impressed on the gate 26 of the field effect transistor 15 to stabilize D.C. bias conditions.

Repeating, the resistors of the low-pass filters must be reasonably large; in the order of $10^7$ ohms. First, this is to match the impedance of the gate circuit of the field effect transistor 15 and, secondly, to allow a small capacitor 42 to be used between terminal 46 and ground 45.

Figure 3:
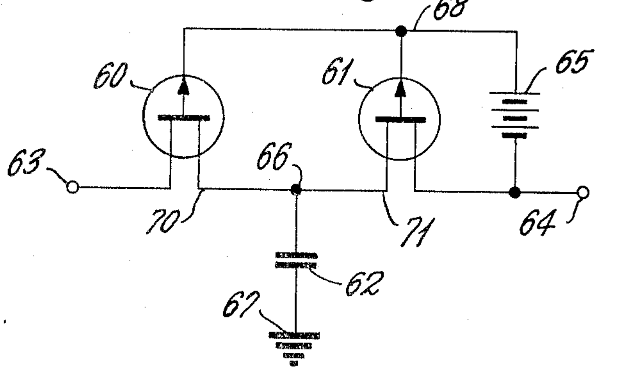
FIGURE 3 is a schematic diagram of a novel low pass filter circuit.

It must be noted that large resistors cannot easily be incorporated in a semiconductor integrated circuit and retain the concept of smallness. Therefore, a low pass filter using field effect transistors is used in the place of a filter using resistors: FIGURE 3 shows two field effect transistors 60 and 61 connected in series, and in combination with capacitor 62 to form a low-pass filter. The characteristics of the channel of the field effect transistors is such that with a reasonably large gate voltage the field effect device is "pinched off" and the resistance of the channel circuit becomes very high, requiring a large voltage across the channel circuit of the field effect transistor in order to produce an appreciable current. With high enough voltage on the gates of the field effect transistors, the resistance of the channel circuits can be made in the order of $10^7$ ohms. In FIGURE 3, the source of one transistor 60 and the drain of the other transistor 61 are connected to a common terminal 66. The gates of the transistors are connected together by lead 68 and to a battery 65. These field-effect transistors are in effect used as voltage variable resistors. They lend themselves to semiconductor integrated circuitry as they can be incorporated as high resistances, and allow the use of a small capacitor 62 which may be in the order of 0.001 microfarad. The battery 65 can be replaced by another potential source. For example, lead 68 can be connected to a tap on the load resistance 20 to provide a high enough gate voltage to make the channel portions of the field effect transistors of sufficiently high resistance to be usable in a low-pass filter.

A semiconductor integrated network embodying the principles of this invention, is shown in FIGURE 4*a*. Starting with an n-type single crystal silicon substrate 100 (7 to 9 ohms-cm. and 3 to 5 mils thick), it is first optically polished on one side. After cleaning, the polished wafer is diffused with gallium from a surface concentration of about $3 \times 10^{16}$ atoms per cubic centimeter to a depth of approximately 0.1 mil to form a p-type layer 102. The wafer is then given a second diffusion of phosphorus from a surface concentration of about $10^{20}$ atoms per cubic centimeter to a depth of from about 0.05 to 0.08 mil. By use of oxide masking, this diffusion is restricted to the area identified by the reference numeral 104. This n-type diffusion produces the gate region of the device. Aluminum can than be evaporated and alloyed to the device as gate, source and drain contacts. It will be appreciated that the unwanted diffused layers on the back and side of substrate 100 can be removed by lapping. In FIGURE 4*a*, ohmic contacts 106 and 110 constitute the source and gate contacts to the field effect device. No connection is made to the drain contact 108 for reasons that will appear hereinafter. With the device as described, transconductance of the order of 50 μmho-per-mil of gate width have been achieved. Also, typical units have been found to have at pinch-off voltage of about 3 volts, and a gate-to-channel breakdown voltage of about 20 volts.

In the foregoing description silicon is noted as the semiconductor material. It should be understood that other semiconductor materials may be employed in the present invention in place of silicon. Thus, such materials as germanium, gallium arsenide, indium antimonide, and other semiconductor materials can be employed. The use of silicon, however, is believed to produce superior results as it lends itself more readily to the fabricating techniques required. This material also has several other advantages that will become more evident as the description of the invention proceeds.

The diffusion operations described above are carried out in a conventional way using suitable temperatures and times as is known in the art. Although the specific illustration given above demonstrating the diffusion steps affords a good understanding of these processes, it will be appreciated that the p-type layer 102 can be produced using any impurity material that will function as required. The diffusion processes are conducted under solid-state conditions, for example, at an elevated temperature of approximately 1200° C. using an amount of impurity to produce the desired surface concentration. The diffusion time is selected to produce penetration of the impurity atoms and the establishment of a PN diffused junction at the desired depth. Masking is utilized, as is known in the art, during the second diffusion step conducted to introduce the n-type impurity into the P-type diffused layer 102 to define the N-type region 104. The depth of penetration of the n-type impurity atoms to establish a PN junction is controlled to leave a p-type conductivity channel beneath the diffused n-type conductivity region 104 approximately 0.02 mil in thickness. The width of the region 104 is approximately 1 mil. It is, therefore, evident that the channel of the field-effect transistor produced by the technique above is approximately 1 mil in length and approximately 0.02 mil in thickness. In the foregoing, the reference to specific materials, times, and temperatures are merely illustrative and not limitative. In fact, the conductivity types of all regions can be reversed as is known in the art and it is equally possible to start with a p-type wafer.

FIGURE 4*a* also shows a unipolar field-effect transistor, a bipolar transistor and a load resistor combined on a single wafer to produce a device having high input impedance. This combination constitutes a unique and novel network. The layer 102 which includes the source and channel of the unipolar transistor is extended to become base region 112 of the bipolar transistor.

A region 121 of the main body of the wafer 100 directly beneath the region 112 constitutes the collector region of the bipolar transistor. There is diffused into the upper surface of the region 112 a suitable n-type impurity to establish a region 120 of n-type conductivity to function as the emitter region of the bipolar transistor. A suitable ohmic contact 122 is made to the surface of the emitter region 120. A lead 124 connects the contact 122 with a tab 126 functioning as the B minus connection for the device. The lead 124 is joined to a contact 128 on the tab 126 by any conventional soldering technique as is well known in the art.

A signal voltage applied via input tab 114, lead 116 and contact 110 to the gate of the unipolar transistor modulates the base current of the unipolar transistor. The reason why the drain contact has been omitted is now evident. The drain end of the unipolar device is contiguous with the base region 112.

The over-all transconductance of the combined device is equal to the product of the $g_m$ of the unipolar region and the $h_{fe}$ of the bipolar region. This circuit is somewhat similar in operation to a "cathode-follower." The bulk resistance of the n-type semiconductor material in the region 130 contiguous to collector region 121 is used as a load resistor. Tab 132 attached to the opposite end of region 130 serves as a load voltage supply connection (B+). Tab 134, connected to a region of the wafer 100 adjacent the collector region 121, would, ordinarily, be used as an output for this circuit arrangement. Lead 136 connects tab 134 to source contact 106. This circuit has the valuable properties of low distortion, high input impedance and low output impedance.

A method of coupling to the input of a bipolar amplifier stage from the collector of a preceding stage is also shown in FIGURE 4*a*. Here a Zener diode 140 having the desired breakdown voltage serves as the coupling element. Diode 140 is formed by diffusing an n-type impurity onto p-type diffused base layer 142 of the second bipolar transistor 143. Once the diode breakdown voltage has been exceeded, it has low incremental resistance, and thus, a high coupling efficiency. The transistor 143 includes an emitter 144 which is also formed by diffusing an n-type impurity onto p-type diffused base layer 142. Region 146 of wafer 100 serves as the collector of the transistor 143. The bulk resistance of region 148 contiguous to collector region 146 serves as a load resistor for the bipolar transistor 143. Tab 150 attached to collector region 146 serves as an output for the over-all combination of elements.

The amplifier elements described above are combined on a single crystal of silicon as a two-stage amplifier as shown in FIGURE 4*a*. To complete the circuit interconnections, lead 152 connects tab 126 with emitter region 144, and lead 154 connects tab 134 with Zener diode 140. Due to 100% negative feedback, the voltage amplification of the first stage (left half of crystal) will be approximately unity and its output impedance will be low. The voltage amplification of the second stage (right half of crystal) will be equal to the product of the resistance of region 148 and the transconductance, $g_m$, of the bipolar transistor 143. Since this stage is being driven from a low impedance source, its voltage amplification will be fairly independent of the $h_{fe}$ of the bipolar transistor 143. Also, it can be shown that if the product of the resistance of region 148 and the collector current ($I_c$) of the bipolar transistor 143, can be held constant, the amplification will not be sensitive to moderate changes in the value of resistance of region 148. If the value of resistance of region 130 is several times the input impedance of the bipolar transistor 143, for example 10K ohms, then moderate changes in its value will have little effect on the amplifier performance. Thus, the tolerance on the values of the resistance of regions 148 and 130 need not be tight.

However, with the circuit as shown, the output transistor 143 will likely not be biased in its active region. A few tenths of a volt variation in the voltage at the collector 121 of the first bipolar transistor will drive the other bipolar transistor 143 either into saturation or cutoff. Even if the second bipolar transistor 143 in its active region, the voltage amplification will be approximately a linear function of the resistance of region 148 and the collector current of the second bipolar transistor. These problems can be greatly reduced by applying a large amount of D.-C. negative feedback to the amplifier, thus maintaining the bias voltage of the output stage substantially fairly constant. Since the input impedance of the amplifier is high, the resistance of the feedback loop can be large without appreciably reducing the D.-C. gain of the feedback loop. A low-pass filter, as shown in FIGURES 2 and 3, can be used. The low-pass filter of FIGURE 3 is preferred if the entire circuit is to be integrated into a single crystal of silicon.

The equivalent circuit of the semiconductor network of FIGURE 4*a* is shown in FIGURE 4*b*.

The amplifier shown in FIGURE 4*a* has been fabricated with a low-pass R-C feedback network, consisting of two 10 megohm resistors and a 0.001-$\mu$f capacitor, and 0.001-$\mu$f input coupling capacitor added. Thus connected, the circuit had a mid-frequency voltage ampification of about 40 db, a bandpass of about 100 to 100,000 cps.

The first stage of the arrangement shown in FIGURE 4*a*, as described, consists of a field-effect transistor in combination with a bipolar transistor having a load resistor in the collector circuit. As shown in FIGURE 4*c*, this same general arrangement can be utilized, but in place of connecting the load resistor in the collector circuit, it can be connected in the emitter circuit. In FIGURE 4*c*, a semiconductor wafer 400, for example of n-type conductivity, is provided. The upper surface of the wafer 400 contains a diffused layer 402 of p-type conductivity. This can be produced in the same manner as was described with reference to FIGURE 4*a*. Also contained in the diffused layer are second and third diffused regions 404 and 406 which are both of n-type conductivity in order to establish the gate of the field-effect transistor and the emitter region of the bipolar transistor. Since the load resistor is to be in the emitter circuit as contrasted with being in the collector circuit, the diffused p-type layer 402 over the remaining portion of the wafer, seen as a surface region 412, is left intact. A slot 408 is cut adjacent to the bipolar transistor in order to electrically insulate by mechanical shaping the surface region 412 of the p-type diffused layer from that portion 402 which actively is employed in the field-effect transistor and the bipolar transistor. Since the load resistor constituted by the remainder of the p-type region is to be in the emitter circuit, a suitable lead 410 connects the emitter region 406 of the bipolar transistor with one end of the remaining p-type diffused layer identified by reference numeral 412. The opposite end of the remaining p-type diffused layer 412 is connected via a suitable lead 414 to a ground terminal 416. The source end 418 of the unipolar field-effect transistor has connected thereto by an ohmic contact 420. A lead 422 is connected between the contact 420 and a terminal 424 which may be connected with a suitable voltage supply. The input to the device is via the gate region 404 of the unipolar transistor by means of a lead 426 attached thereto. A suitable input terminal 428 is provided attached to the opposite end of the lead 426. A suitable output terminal 430 is connected to the lead 410. A suitable contact 432 is made to the collector region of the bipolar transistor, and a lead 434 is attached thereto, for making connection to a voltage supply source. The equivalent circuit for the semiconductor network of FIGURE 4*c* is shown in FIGURE 4*d*.

Of course, the surface region 418 of the unipolar transistor may be connected to the collector region of the bipolar transistor by an external lead similar to the lead 136 of FIGURE 4*a* or the lead 170 of FIGURE 5*a*.

The semiconductor network combining the features of FIGURE 4*a* and FIGURE 3, as previously described, is illustrated in FIGURES 5*a* and 5*b*. As shown, an input terminal 160 connects with a coupling capacitor 162, which is connected to the gate region of a field-effect coupling transistor generally designated by the reference numeral 164. The construction of this portion of the device is the same as described in conjunction with FIGURE 4*a*. The channel of the field-effect transistor 164 connects with the base region of a bipolar transistor, generally designated by the reference numeral 166. This arrangement is again the same as illustrated in FIGURE 4*a*. The load resistance for the bipolar transistor 166 is constituted by the bulk resistance of the region of the semiconductor body 168 contiguous with the collector region of the bipolar transistor 166. A suitable lead 170 interconnects the source end of the field-effect transistor 164 with the collector region of the bipolar transistor 166. A suitable voltage supply is attached to the end of the region 168 remote from the bipolar transistor 166. This attachment is indicated generally by the reference numeral 172. At the opposite end of the semiconductor body, there is located a second stage consisting of a bipolar transistor, designated generally by the reference numeral 174. A Zener diode 176 connects with the base region of the transistor 174. A lead 178 connects the other side of the diode 176 with the collector of the transistor 166. Thus far, the description of the semiconductor network is the same as that for FIGURE 4*a*. The method of manufacturing this semiconductor network is the same as previously given, namely starting with an n-type wafer of silicon into which is diffused a suitable p-type impurity to produce the base regions of the bipolar transistors and the channel of the field-effect transistor. Thereafter, the emitter regions of the bipolar transistors, as well as the gate region of the field-effect transistor, are produced by a subsequent diffusion of an n-type impurity. It will be appreciated that in some cases it will be possible to utilize an alloying technique to establish the emitter regions of the bipolar transistors in the p-diffused layer. Conceivably, an alloy technique can be utilized to establish the gate region for the field-effect transistors. Alloy techniques, however, are not the equivalent of diffusion processes for the reason that they are more difficult to control, and less susceptible of reproducible results. The region between the collector of the transistor 174 and the attachment or contact 172 is generally designated by the numeral 180, and functions as the load resistor for the bipolar transistor 174. In this regard, the bulk resistance of the semiconductor body furnishes the load resistance. An output terminal 182 is attached to the collector region of the transistor 174 by means of a lead 184.

Formed on the semiconductor body above the region 180 are two field-effect transistors joined together and in combination with a capacitor 186 for the purpose of providing a low-pass filter between the output of the transistor 174 and the input to the gate of the field-effect transistor 164. The two field-effect transistors are formed by a p-diffused layer 188 into which has been further diffused two n-type regions 190. Each n-type region defines beneath it the channel for its respective field-effect transistor. The two n-type regions 190 constitute the gates for the field-effect devices, and are connected together by means of a lead 191 and to an intermediate portion of the region 180 by means of lead 192. To stabilize the bias on the gates 190, a Zener diode 200 is formed on the region 180 intermediate the output 182 and supply terminal 172 and connected by lead 199 to the output 182. Lead 193 connects the output lead 184 with a source region 194 at one end of the field-effect devices. The other end of the field-effect devices at contact 195 is connected by means of lead 196 back to the gate of field-effect transistor 164. The region intermediate the two n-type diffused regions 190 is connected by means of a contact 197 and lead 198 to capacitor 186, the other side of which is grounded. The emitter region of transistor 174 is connected to ground. The emitter region of transistor 166 is also connected to ground. By connected to ground is meant that a suitable terminal or tab is provided to which the emitter regions are connected either by leads or other means for the purpose of grounding these areas. The equivalent circuit for the semiconductor network shown in FIGURE 5a is illustrated in FIGURE 5b.

It will be appreciated that the problem of D.-C. bias stability is overcome to a large extent in this semiconductor network by means of the large amount of D.-C. negative feedback that is furnished from the output lead 184 to the gate of the field-effect transistor 164 via the low-pass filter constituted by the field-effect devices located above the region 180 and the capacitor 186. In this connection, the field-effect devices function as voltage-variable resistors and provide resistances in the order of megohms for attenuation, whereas the capacitor 186 functions as an A.-C. shunt or bypass. Thus, the D.-C. is fed back without difficulty, whereas the A.-C. component of the output signal is shunted out of the feedback loop.

In the semiconductor network of FIGURE 5a, capacitors 162 and 186 have not been included. It is possible to fabricate these capacitors from the same wafer used for the network of FIGURE 5a simply by widening the wafer and using the additional space for the fabrication of capacitors 162 and 186. These capacitors can be made either as PN junction types or as oxide types as shown in the aforementioned Kilby application. By this means, the capacitors can be fabricated at the same time as the semiconductor network. After completion, the wafer can be etched through or otherwise divided to separate the network and the capacitors. The three semiconductor parts can then be mounted on a ceramic wafer using tabs and appropriate interconnections.

Although the present invention has been shown and described in terms of preferred embodiments, nevertheless, changes and modifications will occur to those skilled in the art which do not depart from the teachings of this invention. Such changes and modifications are deemed to fall within the purview of this invention.

What is claimed is:

1. A semiconductor network comprising a body of single crystal semiconductor material, a first region of one conductivity type defined by the major bulk of said body, a second region of opposite conductivity type defined by said body adjacent the surface thereof and contiguous to said first region, a third region of said one conductivity type defined in said second region adjacent the surface thereof and spaced from said first region, an isolated portion of said second region being connected to the remainder of said second region by a thin channel portion of said second region underlying said third region, a fourth region of said one conductivity type defined in said second region of said body adjacent the surface thereof and spaced from said first region by a thin base portion and from said third region by an amount greater that the thickness of said base portion, first conductive means contacting said first region at a position closely adjacent said second region, second conductive means contacting said first region at a position spaced from said second region by an amount substantially greater than the spacing between said first conductive means and said second region, third conductive means contacting said isolated portion of said second region, fourth conductive means contacting said third region, and fifth conductive means contacting said fourth region, said first and third conductive means being connected together, means connecting a voltage source between said second and fifth conductive means and means connecting an input signal between said fourth and fifth conductive means, an output signal being derived at said first conductive means, thereby providing operation of the semiconductor network as an amplifier with low input impedance.

2. A semiconductor integrated circuit device comprising:

(a) a thin wafer of single crystal semiconductor material;

(b) a junction transistor formed in the wafer adjacent the surface of one major face thereof by alternate layers of semiconductor material of opposite conductivity-types providing collector, base and emitter regions for the transistor;

(c) a field-effect device formed in the wafer adjacent the surface of said one major face by layers of semiconductor material of opposite conductivity-types providing a source and a drain which are internally connected only by a thin channel underlying a gate region;

(d) a resistor provided in the wafer by an elongated region of semiconductor material which is laterally spaced away from the transistor and the field-effect device for at least the major portion of its length, one end of the resistor being electrically connected to one of the emitter region and the collector region of the junction transistor;

(e) means electrically connecting the drain region of the field-effect device to the base region of the junction transistor;

(f) means including a metallic contact adherent to said one major face of the wafer overlying said gate region for applying variable signal potentials to said gate region;

(g) and means including metallic contacts adherent to said one major face of the wafer for supplying operating bias to the collector and emitter regions of the junction transistor through the resistor and to the source region of the field-effect device.

3. An integrated circuit device according to claim 2 wherein the elongated region which provides the resistor is a shallow diffused surface region of the wafer adjacent said one major face and is laterally spaced away from the junction transistor and from the field-effect device along said one major face.

References Cited by the Examiner

UNITED STATES PATENTS

| | | | |
|---|---|---|---|
| 2,735,948 | 2/1956 | Sziklai | 330—38 |
| 2,816,228 | 12/1957 | Johnson | 330—38 |
| 2,836,797 | 5/1958 | Ozarow | 330—38 |
| 2,959,741 | 11/1960 | Murray | 330—19 |
| 2,985,804 | 5/1961 | Buien | 330—39 X |
| 3,025,472 | 3/1962 | Greatbatch | 330—20 X |
| 3,026,485 | 3/1962 | Suran | 307—88.5 |
| 3,074,003 | 1/1963 | Luscher | 317—235 X |

OTHER REFERENCES

Huang et al., Field Effect Transistor Circuit Design, Electronic Design, Oct. 1955, pp. 42–45.

Langford, Three Approaches to Microminiaturization, Electronics, Dec. 11, 1959, pages 49–52.

Wallmark et al., Integrated Semiconductor Devices, RCA Engineers, vol. 5, No. 1, June 1959, pages 42–45.

ROY LAKE, *Primary Examiner.*

ELI J. SAX, JOHN KOMINSKI, NATHAN KAUFMAN, *Examiners.*